(12) United States Patent
Lehnhardt et al.

(10) Patent No.: US 10,862,003 B2
(45) Date of Patent: Dec. 8, 2020

(54) COMPONENT HAVING ENHANCED EFFICIENCY AND METHOD FOR PRODUCTION THEREOF

(71) Applicant: OSRAM OLED GMBH, Regensburg (DE)

(72) Inventors: Thomas Lehnhardt, Regensburg (DE); Werner Bergbauer, Windberg (DE); Jürgen Off, Regensburg (DE); Lise Lahourcade, Regensburg (DE); Philipp Drechsel, Regensburg (DE)

(73) Assignee: OSRAM OLD GMBH, Regensburg (DE)

( * ) Notice: Subject to any disclaimer, the term of this patent is extended or adjusted under 35 U.S.C. 154(b) by 0 days.

(21) Appl. No.: 16/303,571

(22) PCT Filed: May 18, 2017

(86) PCT No.: PCT/EP2017/062000
§ 371 (c)(1),
(2) Date: Nov. 20, 2018

(87) PCT Pub. No.: WO2017/198776
PCT Pub. Date: Nov. 23, 2017

(65) Prior Publication Data
US 2020/0119228 A1    Apr. 16, 2020

(30) Foreign Application Priority Data

May 20, 2016    (DE) .................... 10 2016 208 717

(51) Int. Cl.
*H01L 33/24*    (2010.01)
*H01L 33/00*    (2010.01)
(Continued)

(52) U.S. Cl.
CPC ............ *H01L 33/24* (2013.01); *H01L 33/007* (2013.01); *H01L 33/06* (2013.01); *H01L 33/18* (2013.01); *H01L 33/325* (2013.01); *H01L 33/38* (2013.01)

(58) Field of Classification Search
None
See application file for complete search history.

(56) References Cited

U.S. PATENT DOCUMENTS

| 4,644,553 A | 2/1987 | Van Ruyven et al. |
| 7,446,345 B2 | 11/2008 | Emerson et al. |

(Continued)

FOREIGN PATENT DOCUMENTS

| DE | 102012217640 A1 | 4/2014 |
| DE | 102015104150 A1 | 9/2016 |

(Continued)

OTHER PUBLICATIONS

Hangleiter, A. et al., "Suppression of Nonradiative Recombination by V-Shaped Pits in GaIN/GaN Quantum Wells Produces a Large Increase in the Light Emission Efficiency," Physical Review Letters, American Physical Society, vol. 95, No. 12, Sep. 16, 2005, 4 pages.

*Primary Examiner* — Anthony Ho
*Assistant Examiner* — Kevin Quinto
(74) *Attorney, Agent, or Firm* — Slater Matsil, LLP

(57) ABSTRACT

A component having an enhanced efficiency and a method for producing a component are disclosed. In an embodiment, a component includes a semiconductor layer sequence comprising a p-conducting semiconductor layer, an n-conducting semiconductor layer and an active zone located therebetween, wherein the active zone comprises recesses on a side of the p-conducting semiconductor layer, each recess having facets extending obliquely to a main surface of the active zone, and wherein the p-conducting semiconductor layer extends into the recesses, and a barrier structure, wherein the (Continued)

active zone is arranged between the barrier structure and the n-conducting semiconductor layer so that an injection of positively charged charge carriers into the active zone via the main surface is hindered in a targeted manner so that an injection of positively charged charge carriers into the active zone via the facets is promoted.

15 Claims, 2 Drawing Sheets

(51) Int. Cl.
*H01L 33/06* (2010.01)
*H01L 33/18* (2010.01)
*H01L 33/32* (2010.01)
*H01L 33/38* (2010.01)

(56) References Cited

U.S. PATENT DOCUMENTS

| | | |
|---|---|---|
| 7,535,031 B2 | 5/2009 | Kim et al. |
| 8,421,057 B2 | 4/2013 | Yan et al. |
| 8,525,221 B2 | 9/2013 | Lester et al. |
| 8,828,752 B2 | 9/2014 | Ting |
| 9,293,647 B2 | 3/2016 | Kashihara et al. |
| 9,502,611 B2 | 11/2016 | Leirer et al. |
| 10,475,951 B2 | 11/2019 | Loeffler et al. |
| 2006/0246612 A1 | 11/2006 | Emerson et al. |
| 2010/0295088 A1* | 11/2010 | D'Evelyn ........... H01L 33/0079 257/99 |
| 2011/0121357 A1 | 5/2011 | Lester et al. |
| 2013/0082236 A1 | 4/2013 | Ramer et al. |
| 2013/0082273 A1* | 4/2013 | Ting ................. H01L 21/02458 257/76 |
| 2013/0100978 A1 | 4/2013 | Hardy et al. |
| 2014/0225059 A1 | 8/2014 | Yang et al. |
| 2015/0060762 A1 | 3/2015 | Kim et al. |
| 2015/0249181 A1 | 9/2015 | Leirer et al. |
| 2015/0349200 A1 | 12/2015 | Chen et al. |
| 2016/0118540 A1 | 4/2016 | Dong et al. |
| 2018/0062031 A1 | 3/2018 | Hirai et al. |
| 2018/0083160 A1 | 3/2018 | Meyer et al. |

FOREIGN PATENT DOCUMENTS

| | | |
|---|---|---|
| DE | 102015104700 A1 | 9/2016 |
| EP | 1267422 A2 | 12/2002 |
| EP | 2843714 A1 | 3/2015 |
| EP | 2999011 A1 | 3/2016 |
| JP | S60192381 A | 9/1985 |
| JP | 2006339426 A | 12/2006 |
| JP | 2007081416 A | 3/2007 |
| JP | 2008218746 A | 9/2008 |
| JP | 2008539585 A | 11/2008 |
| JP | 2012009810 A | 1/2012 |
| JP | 2013512567 A | 4/2013 |
| JP | 2013120774 A | 6/2013 |
| JP | 2014518014 A | 7/2014 |
| JP | 2015046598 A | 3/2015 |
| JP | 2015534274 A | 11/2015 |
| WO | 2014166764 A1 | 10/2014 |
| WO | 2016146376 A1 | 9/2016 |

* cited by examiner

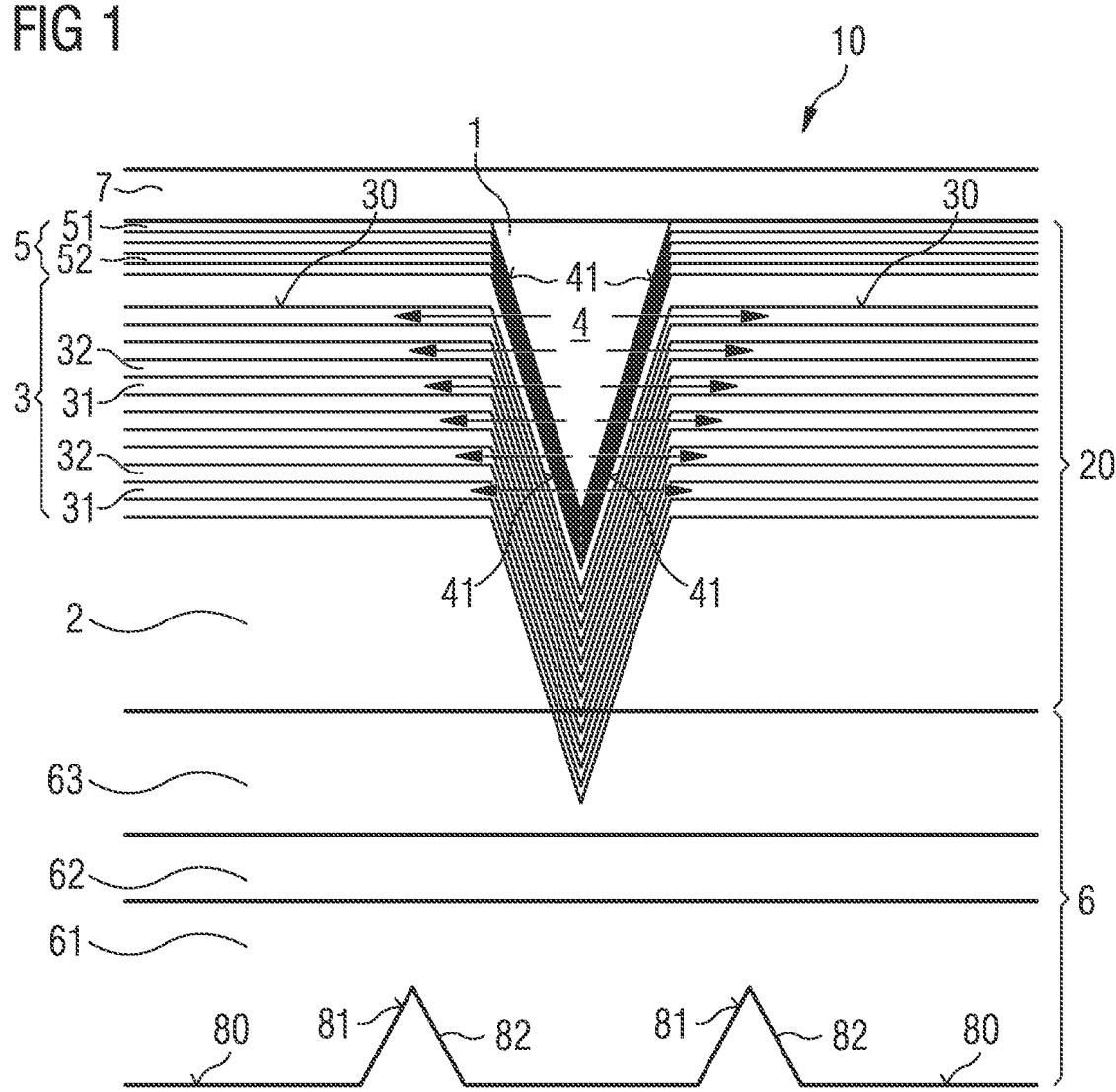

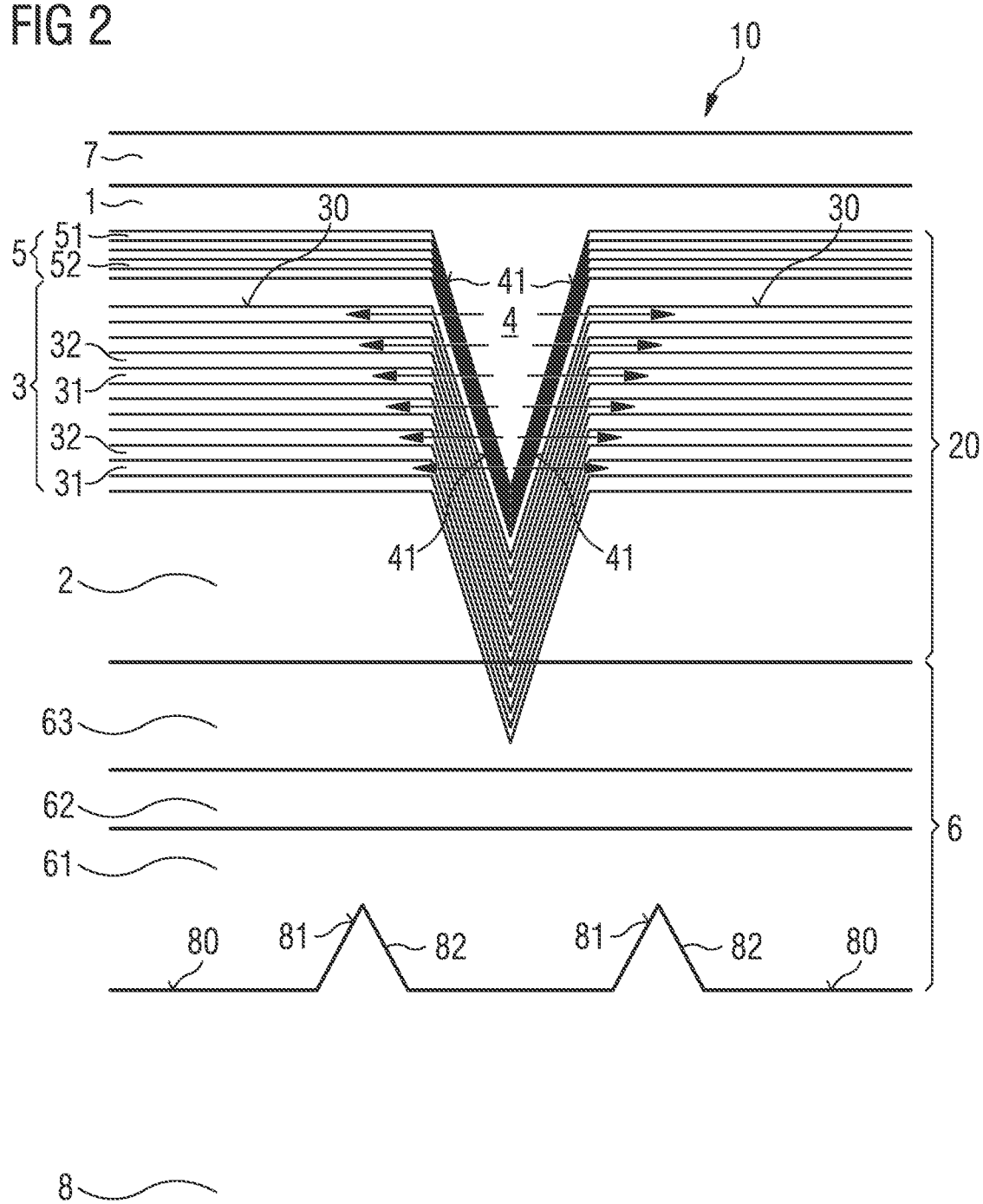

COMPONENT HAVING ENHANCED EFFICIENCY AND METHOD FOR PRODUCTION THEREOF

This patent application is a national phase filing under section 371 of PCT/EP2017/062000, filed May 18, 2017, which claims the priority of German patent application 10 2016 208 717.7, filed May 20, 2016, each of which is incorporated herein by reference in its entirety.

TECHNICAL FIELD

The present application relates to a component having uniform current injection and a method for producing a component.

BACKGROUND

In optoelectronic components, which are based on a semiconductor material and comprise an active zone, in particular a multiple quantum well structure, it has been shown that charge carriers within the active zone are not evenly distributed over the entire active zone, resulting in efficiency losses of such optoelectronic components.

SUMMARY OF THE INVENTION

Embodiments provide a component having increased efficiency. Embodiments further provide an efficient method for producing a component.

According to at least one embodiment of a component, it has a semiconductor layer sequence having an active zone. The active zone is especially configured for generating electromagnetic radiation. For example, the active zone has a multiple quantum well structure having a plurality of quantum barrier layers and quantum well layers located therebetween. The active zone is located between a p-side and an n-side of the component, for example, between a p-conducting semiconductor layer and an n-conducting semiconductor layer of the semiconductor layer sequence. The semiconductor layer sequence is based in particular on a III-V compound semiconductor material. It is also possible that the semiconductor layer sequence is based on a II-VI compound semiconductor material. For example, the component is an optoelectronic component, such as a light-emitting diode (LED).

For obtaining high efficiency of the component, it is desirable to inject positively charged charge carriers (holes) from the p-side and negatively charged charge carriers (electrons) from the n-side as homogeneously as possible into the active zone. It is also particularly desirable to achieve a balance, for example, with regard to the charge carrier density, between the comparatively less mobile holes and the more mobile electrons in the quantum films of the active zone.

According to at least one embodiment of the component, at least one or a plurality of recesses are formed in the region of the active zone on the side of the p-conducting semiconductor layer. In the direction from the p-side towards the n-side of the component, the recess has a decreasing cross section. In sectional view, the recess is for instance V-shaped. For example, the recess has the shape of an inverse pyramid comprising for instance a hexagonal cross section and six facets, an inverse truncated pyramid, an inverse cone or a truncated cone. The recess or the plurality of recesses can be formed by one or a plurality of V-pits (German: V-Defekte). Such a V-pit in the semiconductor layer sequence can be produced by adjusting suitable growth parameters such as the growth rate in an epitaxy process, the temperature or pressure in an epitaxy reactor and/or the type as well as the concentration of the dopants and/or the material composition, for example, with respect to the III-V or II-VI material ratio in the individual layers of the semiconductor layer sequence.

According to at least one embodiment of the component, the recess has a shell surface in the form of facets which form in particular the inner walls of the recess. The facets are arranged for instance obliquely to each other. Two adjacent facets can therefore be angled to each other. However, it is also conceivable for the adjacent facets to merge into one another at least partially or even completely so that in total the facets form a substantially continuously differentiable inner surface of the recess, for example, if the recess has the form of an inverse cone or a truncated cone.

According to at least one embodiment of the component, the active zone has a main surface which runs substantially parallel to a c-plane of the semiconductor layer sequence. In particular, the main surface of the active zone is a c-surface. A c-surface, i.e., (0001)-surface, is understood to mean a crystal surface having a c-direction, i.e., having a <0001>-crystal orientation. A main surface of a layer is generally understood to mean a main extension surface of the layer, wherein the main surface at least partially delimits the corresponding layer in a vertical direction. A vertical direction is understood to mean a direction that is particularly perpendicular to the main surface of the active zone or of the semiconductor layer sequence. In particular, the vertical direction is parallel to a growth direction of the epitaxially grown semiconductor layer sequence of the component. A lateral direction is understood to mean a direction that runs parallel to the main surface of the active zone or of the semiconductor layer sequence.

For example, the semiconductor layer sequence can be epitaxially applied onto a main surface of a substrate, in particular of a growth substrate. The substrate can be a sapphire substrate. Preferably, the main surface of the sapphire substrate is substantially a c-surface. If the layers of the semiconductor layer sequence are epitaxially deposited on the main surface of the substrate, the respective layers of the semiconductor layer sequence generally exhibit a <0001>-orientation. The layers of the semiconductor layer sequence can therefore have a c-surface, i.e., a (0001)-surface, as the main surface. For example, the main surface of the active zone is a c-surface. Preferably, the growth direction of the semiconductor layer sequence is perpendicular to the main surface of the substrate or to the c-surface. Thus, the growth direction is in particular parallel to the c-direction, i.e., to the <0001>-crystal orientation of the semiconductor layer sequence. The substrate can also be made of Si or SiC or glass. In this case, the main surface of the substrate may be different from a c-surface.

According to at least one embodiment of the component, it has a barrier structure. In particular, the barrier structure is located on a main surface of the active zone, i.e., on the p-side of the active zone, facing away from the n-conducting semiconductor layer. The barrier structure runs preferably conformally to the facets of the recess or recesses at least in places. The barrier structure can have a plurality of alternating first layers and second layers. The materials of the first and second layers are chosen with regard to their band gap structure in such a way that the barrier structure is formed in particular as a barrier for charge carriers. In particular, the barrier structure has a plurality of alternating AlGaN and GaN layers or AlGaN and InGaN layers. The barrier structure can be formed as part of the semiconductor layer sequence.

Preferably, the barrier structure is configured in such a way that the barrier structure prevents or at least hinders the negatively and/or positively charged charge carriers from passing through the barrier structure. For instance by appropriate doping or by varying the layer thickness, it is possible for the barrier structure to be formed in such a way that the barrier structure not only acts as an electron barrier but also as a hole barrier in the regions within the recesses, i.e., for instance on the main surface of the active zone. In the regions of the recesses, i.e., for example, on the facets of the recesses, the barrier structure is preferably formed, in particular with regard to its material composition and/or doping and/or layer thickness, in such a way that the holes are injectable throughout the barrier structure into the active zone. In virtue of such configuration of the barrier structure, the injection of positively charged charge carriers into the active zone via the main surface of the active zone and thus via the c-surface is hindered or blocked in a targeted manner, so that the corresponding current flow is concentrated more strongly in the regions of the recesses, as a result of which the injection of positively charged charge carriers into the active zone via the facets of the recesses is promoted.

In at least one embodiment of the component, it has a semiconductor layer sequence having a p-conducting semiconductor layer, an n-conducting semiconductor layer and an active zone located therebetween. In the region of the active zone on the side of the p-conducting semiconductor layer, recesses are formed, which in each case have facets that run obliquely to a main surface of the active zone. The p-conducting semiconductor layer extends into the recesses. The component has a barrier structure arranged especially on the main surface of the active zone facing the p-conducting semiconductor layer. The active zone is thus arranged between the barrier structure and the n-conducting semiconductor layer. In order to obtain the most even possible distribution of the charge carriers in the active zone, the component is formed with regard to the p-conducting semiconductor layer and the barrier structure in such a way that, during operation of the component, an injection of positively charged charge carriers into the active zone via the main surface is hindered in a targeted manner, as a result of which an injection of positively charged charge carriers into the active zone via the facets of the recesses is promoted.

By means of the recesses, the holes from the p-conducting semiconductor layer can be effectively injected particularly via the obliquely formed facets of the recesses into various regions of the active zone, in particular into various quantum well layers which are arranged one above the other in the vertical direction, as a result of which those quantum well layers arranged comparatively farther from the p-conducting semiconductor layer are better energized, since the holes do not need to be first injected throughout the quantum well layers or the quantum barrier layers arranged closer to the p-conducting semiconductor layer.

However, if a significant proportion of the holes continues to be injected into the active zone outside the recesses via the main surface of the active zone, i.e., via the c-surface, a particularly uniform distribution of the holes over all quantum well layers of the active zone is difficult to achieve, since the penetration probability of the holes injected via the main surface into the active zone decreases strongly with increasing penetration depth, i.e., with increasing number of quantum barrier layers in the active zone. If the injection of the holes into the active zone via the main surface is hindered or blocked in a targeted manner, the holes that have reached the active zone can essentially only be injected into different quantum well layers of the active zone via the facets of the recesses. The current flow into the active zone is therefore reduced in a targeted manner in the regions on the c-surface. The current flow is increasingly concentrated rather in the regions of recesses. Thus, it can be achieved that the density of the holes remains essentially the same in all quantum well layers, i.e., in the entire active zone. Due to the targeted prevention or blocking of the penetration of the holes into the active zone via the main surface of the active zone, the probability of injection of the positively charged charge carriers into the n-side quantum well layers, which are arranged farther from the p-conducting semiconductor layer, is increased, so that the charge carrier density with regard to the holes is increased in the region of the active zone spaced apart from the p-side, as a result of which the distribution of the holes in the active zone is particularly homogeneous along the vertical direction and the efficiency of the component is thereby increased. Due to such a configuration of the component, the charge carriers are thus homogenized at least along the lateral direction.

According to at least one embodiment of the component, with regard to the arrangement and/or the configuration of the p-conducting semiconductor layer and/or of the barrier structure, the component is configured in such a way that at least 80%, preferably at least 90%, especially preferably at least 95% of the positively charged charge carriers reaching the active zone are injectable into the active zone via the facets of the recesses. In particular, the injection of the holes into the active zone via the main surface of the active zone can be hindered or blocked in a targeted manner if the barrier structure has an increased layer thickness and/or a different dopant concentration and/or a different metal content in the regions on the main surface compared to the regions on the facets of the recesses. Alternatively or in addition, with regard to the barrier structure, the p-conducting semiconductor layer may be structured in such a way that a passage of the holes into the active zone via the main surface of the active zone is hindered compared to a passage of the holes via the facets of the recesses.

According to at least one embodiment of the component, the p-conducting semiconductor layer is structured in such a way that in a plan view the main surface of the active zone is at least regionally free from being covered by the p-conducting semiconductor layer. Within the recesses, the barrier structure is located between the p-conducting layer and the active zone. In a plan view and outside the recesses, the barrier structure is particularly partially void and preferably completely void of the p-conducting layer. In this case, the barrier structure can be formed as a pure electron barrier.

In particular, the p-conducting semiconductor layer can be arranged exclusively within the recesses. Preferably, the p-conducting semiconductor layer is formed in such a way that it covers the barrier structure only in the regions inside the recesses and the barrier structure outside the recesses is free from being covered by the p-conducting semiconductor layer. In a plan view, the barrier structure can completely cover the active zone, i.e., also in the regions of the recesses. Since the p-conducting semiconductor layer adjoins the barrier structure in particular exclusively in the regions inside the recesses and the barrier structure furthermore adjoins the active zone, the holes from the p-conducting semiconductor layer can be injected into the active zone mainly or essentially exclusively via the facets.

According to at least one embodiment of the component, the p-conducting semiconductor layer is structured in such a way that it comprises a plurality of islands, wherein the islands are spaced apart in lateral directions. In this case, the p-conducting semiconductor layer is not contiguous. In a plan view, the islands can each cover one or a plurality of recesses. It is possible for each of the islands to cover exactly one recess. The p-conducting semiconductor layer can be formed exclusively inside the recesses. Since the main surface of the active zone is free from being covered by the p-conducting semiconductor layer in this case, the injection of positively charged charge carriers from the p-conducting semiconductor layer into the active zone via the main surface is made particularly difficult in a targeted manner.

According to at least one embodiment of the component, it has a contact layer which in particular adjoins the p-conducting layer in places and the barrier structure in places. The contact layer is configured for contacting the p-conducting semiconductor layer. Preferably, the contact layer, the p-conducting semiconductor layer and the barrier structure are formed with regard to the choice of their materials in such a way that an electrical resistance between the contact layer and the p-conducting semiconductor layer is lower than an electrical resistance between the contact layer and the barrier structure. By means of the contact layer, the laterally separated islands of the p-conducting semiconductor layer can be electrically connected to one another. Moreover, due to the lower electrical resistance, positively charged charge carriers are preferably injected into the active zone via the p-conducting semiconductor layer and the facets of the recesses. The contact layer can be made of a transparent electrically conductive oxide (TCO). During operation of the component, electromagnetic radiation can be emitted through the contact layer. For electrically contacting the n-conducting semiconductor layer, the component can have a further contact layer.

According to at least one embodiment of the component, the barrier structure covers the main surface of the active zone in a plan view and is formed in such a way that the barrier structure acts as a hole barrier outside the recesses. However, it is also conceivable that the barrier structure simultaneously acts as an electron barrier. The barrier structure is conveniently arranged between the p-conducting semiconductor layer and the active zone.

In particular, the barrier structure has a first layer thickness within the recesses, for example, in the regions on the facets, and a second layer thickness outside the recesses, i.e., in the regions on the main surface of the active zone. The first and second layer thicknesses are especially configured in such a way that the positively charged charge carriers can penetrate, in particular tunnel through the barrier structure in the regions of the recesses and are blocked by the barrier structure outside the recesses. For example, the first layer thickness is at least three times, preferably at least five times, especially preferably at least ten times smaller than the second layer thickness.

According to at least one embodiment of the component, the active zone is formed from a III-V compound semiconductor material. For example, the active zone has a plurality of GaN and InGaN layers arranged alternately one above the other. For forming a hole barrier, the barrier structure can be doped with silicon at least in places. Preferably, the barrier structure is formed from a plurality of consecutive semiconductor layers based on AlGaN and GaN or on AlGaN and InGaN.

In at least one embodiment of a method for producing one or a plurality of components each having a semiconductor layer sequence comprising a p-conducting semiconductor layer, an n-conducting semiconductor layer and an active zone located therebetween, a growth substrate is provided. A transition layer is applied onto the growth substrate, wherein for forming recesses in the semiconductor layer sequence, crystal defects are formed in the transition layer in particular by varying growth parameters. The semiconductor layer sequence is applied onto the transition layer in such a way that the recesses extend from the transition layer at least into the n-conducting semiconductor layer and into the entire active zone, so that the recesses each have facets running obliquely to a main surface of the active zone. A barrier structure is formed on the active zone. The p-conducting semiconductor layer and/or the barrier structure are formed in such a way that, during operation of the component, an injection of positively charged charge carriers into the active zone via the main surface of the active zone is hindered in a targeted manner, as a result of which an injection of positively charged charge carriers into the active zone via the facets of the recesses is promoted.

According to at least one embodiment of the method, the semiconductor layer sequence is epitaxially grown onto the growth substrate, for example, by metal-organic vapor phase epitaxy (MOVPE) or metal-organic chemical vapor deposition (MOCVD). In particular, the recesses are formed as V-pits or as V-defects in the transition layer, in the active zone and in the barrier structure. The structure of the recesses initially formed in the transition layer continues to extend in particular into the semiconductor layer sequence, for example, into the active zone and into the barrier structure.

According to at least one embodiment of the method, the transition layer is applied in particular directly onto a main surface of the growth substrate. The growth substrate is preferably a sapphire substrate, especially having a c-surface as the main surface. Thus, the transition layer and the layers being grown thereon, for instance the layers of the active zone, generally have a c-surface as the main surface. The recesses are each delimited for instance by six or twelve facets formed by non-polar or semi-polar surfaces. Normally, the facets of the recesses are covered by material of the layers of the semiconductor layer sequence or of the barrier structure. Such facets usually have a <1-101>- or <11-22>-orientation and are thus formed by a (1-101)-crystal surface or by a (11-22)-crystal surface.

By adjusting the growth conditions in a targeted manner, a considerably thinner layer thickness can be achieved on the facets rather than on the main surface, namely on the c-surface. If the barrier structure is doped, e.g., p-doped, fewer foreign atoms are embedded in the barrier structure in the regions within the recesses due to the polarity of the facets and lower growth rate on the facets. By an epitaxial method, in which the recesses are generated in the transition layer in a targeted manner, the layers of the semiconductor layer sequence or of the barrier structure can be formed in such a way that the layer thickness of these layers on the facets, i.e., in the regions of the recesses, is significantly thinner than on the respective main surface outside the recesses, i.e., on the c-surface. This results in the technical effect that holes can be injected more efficiently into the active zone via the facets of the recesses than via the main surface of the active zone. If the barrier structure containing for instance a plurality of layers arranged alternately one above the other, for example, GaN and AlGaN-based layers, is additionally doped with Si, the barrier structure acts as a hole barrier outside the recesses on the c-surface. Due to the thinner layer thickness and/or lower dopant concentration of the barrier structure within the recesses, the barrier structure can still be formed in such a way that holes can penetrate the barrier structure in the regions of the recesses and easily reach the active zone via the facets.

According to at least one embodiment of the method, the p-conducting semiconductor layer is applied onto the barrier structure in such a way that the p-conducting semiconductor layer, when viewed from above, covers the barrier structure in particular completely and fills the recesses. In a subsequent method step, the material of the p-conducting semiconductor layer can be removed to partially expose the barrier structure in the regions outside the recesses. In particular, the p-conducting semiconductor layer is partially selectively etched. The etching process can be carried out outside the epitaxy reactor, i.e., ex situ, in a simplified manner.

It is particularly preferred that the barrier structure contains aluminum. In particular, the barrier structure has at least one or a plurality of AlGaN-based layers having GaN-based layers located therebetween. The GaN-based layers may also contain a small amount of indium or aluminum. For forming the hole barrier, the barrier structure is preferably doped with Si. For partially exposing the barrier structure, during the process of etching the p-conducting semiconductor layer, the aluminum-containing barrier structure can serve as an etch stop layer.

According to at least one embodiment of the method, the barrier structure is formed after the active zone and before the p-conducting semiconductor layer, wherein the barrier structure has a reduced layer thickness in the region of the recesses and is selectively doped with Si to form a hole barrier layer such that an injection of positively charged charge carriers via the main surface into the active zone is made more difficult than an injection of positively charged charge carriers via the facets of the recesses into the active zone. Both the p-conducting semiconductor layer and the barrier structure can be arranged regionally within the recesses. Outside and/or inside the recesses, the barrier structure may be completely covered by the p-conducting semiconductor layer. It is possible that the barrier structure is free or completely free of a coverage by the p-conducting semiconductor layer in the regions outside the recesses, i.e., on the main surface of the active zone or on the c-surface.

The method described above is particularly suitable for the production of a component described here. Features described in connection with the component can therefore also be used for the method and vice versa.

BRIEF DESCRIPTION OF THE DRAWINGS

Further advantages, preferred embodiments and further developments of the method and of the component will become apparent from the exemplary embodiments explained below in conjunction with FIGS. 1 to 2.

FIG. 1 shows a schematic illustration of an exemplary embodiment of a component; and FIG. 2 shows a schematic illustration of another exemplary embodiment of a component.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

FIG. 1 shows a component 10 having a carrier 8 on which a semiconductor layer sequence 20 is arranged. The carrier 8 can be a growth substrate on which the semiconductor layer sequence 20 has been epitaxially grown, for example. The semiconductor layer sequence 20 has an active zone 3 which is arranged between a first, for instance p-conducting semiconductor layer 1, and a second, for instance n-conducting semiconductor layer 2. In particular, the active zone 3 is configured for generating electromagnetic radiation during operation of the component 10.

The active zone 3 has a multiple quantum well structure comprising a plurality of alternating quantum well layers 31 and quantum barrier layers 32. The number of quantum well layers 31 is at least 3 or at least 5 and is, for example, between 3 and 20 inclusive, for instance between 3 and 15 inclusive, for instance 9. The quantum well layers 31 and quantum barrier layers 32 may be based on a III-V compound semiconductor material, for instance on InGaN or GaN, respectively. During operation of the component 10, positively charged charge carriers, namely holes from the first semiconductor layer 1, and negatively charged charge carriers, namely electrons from the direction of the second semiconductor layer 2, are injected into the active zone 3 for generating radiation.

A transition layer 6 is arranged between the carrier 8 and the semiconductor layer sequence 20. In particular, the transition layer 6 has a first undoped partial layer 61, such as an undoped GaN partial layer. Furthermore, the transition layer 6 may have a second n-doped partial layer 62 and a third n-doped partial layer 63, each of which may be a GaN layer doped with Si. The dopant concentration of the partial layers 62 and 63 is about $1.2*10^{19}$ cm$^{-3}$, for example. The undoped partial layer 61 is located between the carrier 8 and the n-doped partial layer 62. However, it is possible for the undoped partial layer 61 to contain a small amount of dopants diffusing into the undoped partial layer 61 for instance from the adjacent doped layers. The undoped partial layer 61 may therefore have a low concentration of dopants, wherein the partial layer 61, in particular, is not intentionally doped.

In particular, the carrier 8 is a growth substrate having a main surface 80. In the case of a sapphire substrate, the main surface 80 may be a c-surface, i.e., a (0001) crystal surface. In particular, the carrier 8 has elevations 82 on the main surface 80. The shell surfaces 81 of the elevations 82 may differ from the <0001>-crystal orientation and therefore differ in particular from the c-surface. The carrier 8 has a vertical layer thickness of several hundred micrometers. For example, the layer thickness of the carrier 8 is about 1 mm. The elevations 82 may each have a vertical height of a few micrometers, in particular between 1 and 5 micrometers inclusive, for instance 1.6 micrometers.

The undoped partial layer 61 of the transition layer 6 is preferably applied directly onto the main surface 80 of the carrier 8 using an epitaxial method. The undoped partial layer 61 can have a vertical height of a few micrometers, for instance 4 micrometers. The n-doped partial layers 62 and 63 of the transition layer 6 are preferably formed directly on the undoped partial layer 61. The undoped partial layer 61 is formed in particular to coalesce the semiconductor material over possible unevenness on the main surface 80 of the carrier 8. For instance, the first undoped partial layer 61 and the second n-doped partial layer 62 form a buffer layer. The third partial layer 63 may have the same or a higher concentration of dopants than the second partial layer 62. It is possible for the n-doped partial layers 62 and 63 to be formed in a common method step.

Due to different lattice constants, however, mechanical stresses can arise within the semiconductor material, leading to crystal defects such as dislocations. One type of dislocations in the semiconductor material are threading dislocations (German: Fadenversetzungen), some of which propagate along the growth direction of the semiconductor layers and can therefore run essentially perpendicular to the carrier 8. This effect is used in a targeted manner for the generation of recesses 4 in the form of V-pits or V-defects in the transition layer 6, in particular in the n-doped partial layer 63, for instance by adjusting suitable growth parameters such as growth rate, temperature or pressure and/or by adjusting the type and concentration of the dopants and/or the material composition in particular with regard to the material ratio of the semiconductor material. For example, the temperature, the proportion of H2 and/or the flow rate of NH3 in the epitaxy reactor can be adjusted or varied accordingly. The finished recesses 4 usually have facets 41 which differ from the c-surface. In particular, the facets 41 have a <1-10x>- or <11-2y>-orientation with $\{x, y\}=\{1, 2, 3\}$. Such facets are (1-10x)-crystal surfaces or (11-2y)-crystal surfaces with $\{x, y\}=\{1, 2, 3\}$, respectively. If the transition layer 6 is deposited on the carrier 8 having a substantially flat main surface 80 and additional elevations 82, the positions of the recesses 4 can be partly defined by the elevations 82. In a plan view, the recess 4 can be formed in lateral directions between two adjacent elevations 82. However, contrary to FIG. 1, the carrier 8 may be free from the elevations 82.

In an epitaxial growth of the semiconductor layer sequence 20, the structure of the recesses 4 continues to grow from the transition layer 6 towards the semiconductor layer sequence 20. Thus, the active zone 3 also has the structure of the recesses 4. In particular outside the recesses 4, the active zone 3 has a main surface 30 facing away from the transition layer 6 or the carrier 8, which is for instance a c-surface. In the regions of the recesses 4, the active zone 3 covers the facets 41 in particular completely. The recesses 4 each have a vertical depth. In particular, the depth of the recesses 4 is between 100 nm and 1000 nm inclusive, in particular between 100 nm and 500 nm inclusive, for instance about 200 nm or 400 nm.

The component 10 has a barrier structure 5. The barrier structure 5 comprises a plurality of alternating first layers 51 and second layers 52. The number of the first layers 51 or of the second layers 52 is for instance at least two, in particular at least three or at least five. For example, the first layers 51 are based on or consist of AlGaN. The second layers 52 are based on or consist of GaN. The second layers 52 may contain small proportions of indium, for example, between 0.01% and 10% inclusive or between 0.01% and 3% inclusive, or between 0.1% and 3% inclusive. In particular, the barrier structure 5 is directly adjacent to the active zone 3. The barrier structure 5 can be formed on the active zone 3 by an epitaxy method and can therefore be part of the semiconductor layer sequence 20. In FIG. 1, within the production tolerances, the barrier structure 5 having the first layers 51 and the second layers 52 essentially runs conformally to the structure of the active zone 3. Thus, the barrier structure 5 also comprises recesses 4. Outside the recesses 4, the barrier structure 5 can have a c-surface as its main surface. In the regions of the recesses 4, similar to the active zone 3, the barrier structure 5 has facets whose orientation differs from that of the c-surface.

Due to the different adjustable growth rates on the main surface and on the facets, the layers on the facets have a considerably lower layer thickness than the respective layers of the active zone 3 and/or of the barrier structure 5. In other words, the respective layers have a significantly lower overall layer thickness in the region of the recesses 4 than on the main surface, namely on the c-surface, outside the recesses 4. In particular, the layer thickness of the layers of the active zone 3 and/or of the barrier structure 5 on the facets can be at least three times, for instance at least five times or at least ten times smaller than the respective layer times of the corresponding layers on the main surface. The total layer thickness of the active zone 3 and/or of the barrier structure 5 is thus smaller on the facets than on the main surface.

If the barrier structure 5 contains a metal, such as aluminum, and/or if the barrier structure 5 is doped, a metal proportion and/or the amount of dopant of the barrier structure 5 in the regions on the facets within the recesses can be much smaller than in the regions on the main surface 30 outside the recesses 4. As a result of this, it can be achieved that positively charged charge carriers are injected more efficiently into the active zone 3, in particular into various quantum well layers 31, via the facets 41 of the recesses 4 than via the main surface 30 of the active zone 3. Due to the reduced layer thickness on the facets, no degradation in terms of charge transport via the facets into the active zone 3 is to be expected. In virtue of the recesses 4, a spatial distance from the n-side quantum well layers 31 to a partial region of the p-conducting semiconductor layer 1 arranged in the recesses 41 is also significantly smaller than to a further partial region of the p-conducting semiconductor layer 1 arranged outside the recesses 41.

The barrier structure 5 can be n-doped, p-doped, or n-doped in regions and p-doped in regions. As a pure electron barrier, the barrier structure 5 is preferably p-doped, e.g., doped with Mg. Since the barrier structure 5 is arranged on the main surface 30 of the active zone 3 facing away from the n-conducting semiconductor layer 2, a passage of negatively charged charge carriers from the active zone 3 to the p-conducting semiconductor layer 1 is hindered or prevented. As a pure hole barrier, the barrier structure 5 is preferably n-doped, e.g., doped with Si. Due to the different layer thicknesses of the barrier structure 5 on the main surface 30 of the active zone 3 and on the facets 41 of the recesses 4, the barrier structure 5 may be formed such that a passage of the holes from the barrier structure 5 via the main surface 30 to the active zone is blocked or hindered, while the holes in the regions within the recesses 4 can penetrate the barrier structure 5 and reach the active zone 3 via the facets 41. As a pure hole barrier, the barrier structure 5 is preferably free of p-doping, such as of Mg-doping. However, it is also possible for the barrier structure 5 to be n-doped in regions and p-doped in regions, thus forming a hole barrier in regions and an electron barrier in regions. For example, some of the first layers 51 and the second layers 52 of the barrier structure 5 are p-doped, while further first layers 51 and further second layers 52 of the barrier structure 5 are n-doped. In this case, the barrier structure 5 acts as an electron barrier and additionally as a hole barrier in the regions on the main surface 30 of the active zone 3, wherein the holes in the regions of the recesses 4 can still be injected into the active zone 3 via the facets 41.

Along the lateral direction, the barrier structure 5 can therefore have a varying vertical layer thickness and/or varying dopant concentration and/or varying metal content, such as aluminum content. Such properties of the barrier structure 5 can be detected at the component by SIMS (Secondary Ion Mass Spectroscopy) and TEM (Transmission Electron Microscopy).

In FIG. 1, the p-conducting semiconductor layer 1 is arranged exclusively in the recess 4 or in the recesses 4. The p-conducting semiconductor layer 1 can completely fill the recesses 4. Thus, the corresponding current flow is concentrated more strongly in the regions of the recesses 4, wherein the injection of positively charged charge carriers into the active zone 3, in particular into various vertically separated quantum well layers 31, is particularly favored via the facets 41 of the recesses 4. Inside the recesses 4, the barrier structure 5 is arranged between the p-conducting semiconductor layer 1 and the active zone. Outside the recesses 4, the barrier structure 5 is particularly free from being covered by the p-conducting semiconductor layer 1. Thus, the injection of positively charged charge carriers via the barrier structure 5 and via the main surface 30 of the active zone 3 is hindered or blocked. In this case, the barrier structure 5 can even be formed as a pure electron barrier.

For example, the p-conducting semiconductor layer 1 is formed such that it comprises a plurality of islands, wherein the islands are laterally spaced from each other. In a plan view, the islands of the p-conducting semiconductor layer 1 can each cover exactly one of the recesses 4. Deviating from this, it is possible for each of the islands of the p-conducting semiconductor layer 1 to cover a majority of the recesses 4. In this case, the barrier structure 5 may be partially covered by the p-conducting semiconductor layer 1 outside the recesses 4, but it is also conceivable that at least 50% of a main surface of the barrier structure 5 may remain free from being covered by the p-conducting semiconductor layer 1.

The structured p-conducting semiconductor layer 1 can first be applied extensively onto the barrier structure 5 by applying the respective semiconductor material. In a subsequent method step, the p-conducting semiconductor layer 1 can be structured by an etching process, so that the barrier structure 5 is partially exposed. Preferably, the barrier structure 5 contains one or a plurality of aluminum-containing layers, such as AlGaN layers, so that the barrier structure 5 can serve as an etch stop layer. The etching process can be carried out outside the epitaxy reactor, i.e., ex situ, in a simplified manner. Alternatively, it is also possible to structure the p-conducting semiconductor layer in situ, i.e., within the epitaxy reactor, for example, during the MOVPE phase by special choice of growth parameters. For example, the ambient conditions with respect to gas mixture, temperature or pressure can be adjusted in a targeted manner.

The component has a contact layer 7 for electrically contacting the p-conducting semiconductor layer 1. According to FIG. 1, the contact layer 7 adjoins the p-conducting semiconductor layer 1 in places and the barrier structure 5 in places. The choice regarding the materials of the contact layer 7, the p-conducting semiconductor layer 1 and the barrier structure 5 is preferably made such that an electrical resistance between the contact layer 7 and the p-conducting semiconductor layer 1 is lower than an electrical resistance between the contact layer 7 and the barrier structure 5. As a result of this, it can be achieved that the positively charged charge carriers are injected into different quantum well layers 31 of the active zone preferably via the p-conducting semiconductor layer 1 and via the facets 41.

If the contact layer 7 and the barrier structure 5 are in electrical contact, the barrier structure 5 can be formed at least in places as a hole barrier, so that an injection of positively charged charge carriers into the active zone via the barrier structure 5 and via the main surface 30 is hindered or blocked in a targeted manner. In deviation from FIG. 1, it is possible that outside the recesses 4 the barrier structure 5 is partially or completely covered by the p-conducting semiconductor layer 1. The barrier structure 5 can be p-conducting. In particular, the barrier structure 5 can be formed by suitable doping in such a way that, compared to the p-conducting semiconductor layer 1, it has a higher electrical contact resistance to the contact layer 7.

In contrast to FIG. 1, it is also conceivable that outside the recesses 4, a poorly electrically conductive or an electrically insulating layer is arranged in the vertical direction between the contact layer 7 and the barrier structure 5. Thus, in the regions outside the recesses 4, a direct electrical contact between the contact layer 7 and the barrier structure 5 can be prevented.

FIG. 2 shows another exemplary embodiment of a component. The exemplary embodiment of a component shown in FIG. 2 essentially corresponds to the exemplary embodiment shown in FIG. 1. In contrast to this, the p-conducting semiconductor layer 1 is formed in such a way that in a plan view it covers the barrier structure 5 both in the regions inside and in the regions outside the recesses 4. In the regions outside the recesses 4, the barrier structure 5 is preferably formed as a hole barrier. In particular, the barrier structure 5 is n-doped, for example, with Si. The barrier structure 5 can have a superlattice structure made from a plurality of alternately arranged AlGaN and GaN layers or from a plurality of alternately arranged AlGaN and InGaN layers. In a plan view, the p-conducting semiconductor layer 1 can completely cover the barrier structure 5 and/or the active zone 3.

If an injection of positively charged charge carriers into the active zone via the c-surface is hindered or blocked in a targeted manner, for example, by arranging the p-conducting semiconductor layer exclusively within the recesses and/or by forming a hole barrier on the c-surface outside the recesses, the corresponding current flow is concentrated more strongly in the regions of the recesses, as a result of which the injection of positively charged charge carriers into different regions of the active zone is promoted via the facets of the recesses, so that a particularly uniform vertical current distribution is obtained in the active zone, thus resulting in an increase in the efficiency of the component even at high operating currents.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the claims or in the exemplary embodiments.

The invention claimed is:

1. A component comprising:
a semiconductor layer sequence comprising a p-conducting semiconductor layer, an n-conducting semiconductor layer and an active zone located therebetween, wherein the active zone comprises recesses on a side of the p-conducting semiconductor layer, each recess having facets extending obliquely to a main surface of the active zone, and wherein the p-conducting semiconductor layer extends into the recesses; and
a barrier structure,
wherein the active zone is arranged between the barrier structure and the n-conducting semiconductor layer so that an injection of positively charged charge carriers into the active zone via the main surface is hindered in a targeted manner so that an injection of positively charged charge carriers into the active zone via the facets is promoted, and
wherein the p-conducting semiconductor layer is structured such that the main surface of the active zone in a plan view is at least regionally free from being covered by the p-conducting semiconductor layer, and wherein the barrier structure covers the main surface of the active zone in a plane view, and wherein the barrier structure acts as a hole barrier outside the recesses.

2. The component according to claim 1, wherein the main surface of the active zone is a crystal surface of the semiconductor layer sequence.

3. The component according to claim 1, wherein, with regard to an arrangement and/or an configuration of the p-conducting semiconductor layer and/or of the barrier structure, the component is configured such that at least 80% of the positively charged charge carriers reaching the active zone are injectable into the active zone via the facets of the recesses.

4. The component according to claim 1, wherein the barrier structure is void of the p-conducting layer outside the recesses.

5. The component according to claim 1, wherein the p-conducting semiconductor layer comprises a plurality of islands, wherein the islands are spaced apart from each other in a lateral direction, and wherein each island covers at least one of the recesses in a plan view.

6. The component according to claim 1, wherein within the recesses, the barrier structure is arranged between the p-conducting semiconductor layer and the active zone, and wherein outside the recesses in a plan view the active zone is free from being covered by the p-conducting semiconductor layer at least in regions.

7. The component according to claim 1, further comprising a contact layer adjoining the p-conducting semiconductor layer and the barrier structure in regions, wherein the contact layer, the p-conducting semiconductor layer and the barrier structure are formed such that an electrical resistance between the contact layer and the p-conducting semiconductor layer is lower than an electrical resistance between the contact layer and the barrier structure.

8. The component according to claim 1, wherein the barrier structure is based on GaN and is doped with silicon at least in regions.

9. The component according to claim 1, wherein the active zone is based on a III-V compound semiconductor material and has a multiple quantum well structure comprising a plurality of quantum barrier layers and active quantum well layers located therebetween.

10. The component according to claim 1, wherein the barrier structure comprises a plurality of successive semiconductor layers based on AlGaN and GaN.

11. A component comprising:
a semiconductor layer sequence comprising a p-conducting semiconductor layer, an n-conducting semiconductor layer and an active zone located therebetween, wherein the active zone comprises recesses on a side of the p-conducting semiconductor layer, each recess having facets extending obliquely to a main surface of the active zone, and wherein the p-conducting semiconductor layer extends into the recesses; and
a barrier structure;
wherein the active zone is arranged between the barrier structure and the n-conducting semiconductor layer so that an injection of positively charged charge carriers into the active zone via the main surface is hindered in a targeted manner so that an injection of positively charged charge carriers into the active zone via the facets is promoted;
wherein the p-conducting semiconductor layer is structured such that the main surface of the active zone in a plan view is at least regionally free from being covered by the p-conducting semiconductor layer; and
wherein the barrier structure has a first layer thickness within the recesses and a second layer thickness outside the recesses, wherein the first and second layer thicknesses are such that the positively charged charge carriers are able to penetrate the barrier structure in regions of the recesses and are blocked by the barrier structure outside the recesses, and wherein the first layer thickness is at least three times smaller than the second layer thickness.

12. A method for producing a component having a semiconductor layer sequence comprising a p-conducting semiconductor layer, an n-conducting semiconductor layer and an active zone located therebetween, the method comprising:
applying a transition layer onto a growth substrate, wherein crystal defects are formed in the transition layer for forming recesses in the semiconductor layer sequence;
applying the semiconductor layer sequence onto the transition layer so that the recesses extend from the transition layer at least into the n-conducting semiconductor layer and into the active zone so that each recess has facets extending obliquely to a main surface of the active zone;
forming a barrier structure on the active zone; and
forming the p-conducting semiconductor layer and/or the barrier structure such that an injection of positively charged charge carriers into the active zone via the main surface is hindered in a targeted manner so that an injection of positively charged charge carriers into the active zone via the facets is promoted during operation;
wherein at least one of:
the p-conducting semiconductor layer is applied onto the barrier structure such that in a plan view the p-conducting semiconductor layer covers the barrier structure and fills the recesses, and wherein in a subsequent method step material of the p-conducting semiconductor layer is removed for partially exposing the barrier structure outside the recesses; or
the transition layer is applied onto a crystal surface of the growth substrate, wherein the semiconductor layer sequence is formed such that the main surface of the active zone is a crystal surface, wherein the barrier structure is formed after the active zone and before the p-conducting semiconductor layer, wherein the barrier structure has a reduced layer thickness in a region of the recesses, and wherein the barrier structure is selectively doped with Si to form a hole barrier layer such that an injection of positively charged charge carriers into the active zone via the main surface is made more difficult than an injection of positively charged charge carriers into the active zone via the facets of the recesses during operation.

13. The method according to claim 12, wherein the transition layer is applied onto the crystal surface of the growth substrate, wherein the semiconductor layer sequence is formed such that the main surface of the active zone is the crystal surface, wherein the barrier structure is formed after the active zone and before the p-conducting semiconductor layer, wherein the barrier structure has the reduced layer thickness in the region of the recesses, and wherein the barrier structure is selectively doped with Si to form the hole barrier layer such that the injection of positively charged charge carriers into the active zone via the main surface is made more difficult than the injection of positively charged charge carriers into the active zone via the facets of the recesses during operation.

14. The method according to claim 12, wherein the p-conducting semiconductor layer is applied onto the barrier structure such that in the plan view the p-conducting semiconductor layer covers the barrier structure and fills the recesses, and wherein in the subsequent method step material of the p-conducting semiconductor layer is removed for partially exposing the barrier structure outside the recesses.

15. The method according to claim 14, wherein the barrier structure contains aluminum, and wherein, for partially exposing the barrier structure, the p-conducting semiconductor layer is etched and the aluminum-containing barrier structure serves as an etch stop layer.

* * * * *

UNITED STATES PATENT AND TRADEMARK OFFICE
CERTIFICATE OF CORRECTION

Page 1 of 1

PATENT NO. : 10,862,003 B2
APPLICATION NO. : 16/303571
DATED : December 8, 2020
INVENTOR(S) : Thomas Lehnhardt It is certified that error appears in the above-identified patent and that said Letters Patent is hereby corrected as shown below:

On the Title Page

Item (73) Assignee, Line 1, delete "OLD" and insert --OLED--.

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*